United States Patent
Xu et al.

(10) Patent No.: US 9,666,472 B2
(45) Date of Patent: May 30, 2017

(54) METHOD FOR ESTABLISHING MAPPING RELATION IN STI ETCH AND CONTROLLING CRITICAL DIMENSION OF STI

(71) Applicants: Jin Xu, Shanghai (CN); Qiyan Feng, Shanghai (CN); Yu Ren, Shanghai (CN); Yukun Lv, Shanghai (CN); Xusheng Zhang, Shanghai (CN)

(72) Inventors: Jin Xu, Shanghai (CN); Qiyan Feng, Shanghai (CN); Yu Ren, Shanghai (CN); Yukun Lv, Shanghai (CN); Xusheng Zhang, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 15/083,292

(22) Filed: Mar. 29, 2016

(65) Prior Publication Data
US 2017/0025304 A1    Jan. 26, 2017

(30) Foreign Application Priority Data
Jun. 29, 2015    (CN) .......................... 2015 1 0369469

(51) Int. Cl.
H01L 21/00      (2006.01)
H01L 21/762     (2006.01)
H01L 21/027     (2006.01)
H01L 21/308     (2006.01)
H01L 21/66      (2006.01)

(52) U.S. Cl.
CPC .... *H01L 21/76224* (2013.01); *H01L 21/0276* (2013.01); *H01L 21/3081* (2013.01); *H01L 21/3086* (2013.01); *H01L 22/20* (2013.01)

(58) Field of Classification Search
CPC .......... H01L 21/76224; H01L 21/0276; H01L 21/3081; H01L 21/3086; H01L 22/20
USPC .......................................... 438/7–9
See application file for complete search history.

(56) References Cited

U.S. PATENT DOCUMENTS

| | | | |
|---|---|---|---|
| 7,169,682 B2 * | 1/2007 | Hirohama | H01L 21/82348 257/E21.252 |
| 2004/0077163 A1 * | 4/2004 | Chang | H01L 21/0335 438/689 |

(Continued)

*Primary Examiner* — Benjamin Sandvik
*Assistant Examiner* — Herve Assouman

(57) ABSTRACT

The present invention provides a method for controlling a critical dimension of shallow trench isolations in a STI etch process, comprises the following steps: before the STI etch process, pre-establishing a mapping relation between a post-etch and pre-etch critical dimension difference of a BARC layer and a thickness of the BARC layer; and during the STI etch process after coating the BARC layer, measuring the thickness of the BARC layer and determining a trimming time for a hard mask layer according to a critical dimension difference corresponding to the measured thickness in the mapping relation and a critical dimension of a photoresist pattern, then performing a trimming process for the hard mask layer lasting the trimming time to make a critical dimension of the hard mask layer equal to a required critical dimension of an active area, and etching a substrate to form shallow trenches with a predetermined critical dimension.

14 Claims, 3 Drawing Sheets

(56) References Cited

U.S. PATENT DOCUMENTS

2007/0232067 A1* 10/2007 Hirota ............... H01L 21/28123
          438/689
2008/0227298 A1* 9/2008 Hirota ................. H01L 21/3081
          438/693

* cited by examiner

METHOD FOR ESTABLISHING MAPPING RELATION IN STI ETCH AND CONTROLLING CRITICAL DIMENSION OF STI

CROSS-REFERENCE TO RELATED APPLICATION

This application claims the priority benefit of Chinese Patent Application No. 201510369469.7, filed Jun. 29, 2015. All disclosure of the Chinese application is incorporated herein by reference.

FIELD OF THE INVENTION

The present invention generally relates to a method of shallow trench isolation (STI) etch process in the field of semiconductor manufacturing, more particularly, to a method for improving critical dimension control of STI by using an optical critical dimension measurement equipment.

BACKGROUND OF THE INVENTION

Clear to the person skilled in the art, a complete circuit is comprised of multiple separate devices connected to each other through specific electrical pathways. Therefore, every device is manufactured to be isolated but interconnetable during the integrated circuit manufacturing, such that can form a desired circuit structure. With the shrinkage of the dimensions of the semiconductor devices, effects of the STI critical dimensions (CDs) to the electrical properties and yield rate of the devices are becoming ever more critical. Improper isolation may lead to problems such as current leakage, low breakdown voltage, and latch-up effect. Therefore, isolation technology is an important technology in the integrated circuit manufacturing.

Under the sub-65 nm technology node, STI technique is developed and applied in order to improve the circuit performance and device density. As for the STI technique, the CD of the trenches has a profound impact on the electrical properties and yield rate of the devices:

Firstly, as the CDs of the semiconductor devices decrease, the dimension precision of the STI has a more critical effect on the electrical properties of the device. In some areas, a small change in dimension may cause a dramatic change in electrical properties, as shown in FIG. 1.

Secondly, the dimensions of the trenches have a profound impact on the yield rate and ultimate stability of the product, for example, when the dimension of a shallow trench is varied near a limited dimension, the device qualification may sharply decline, even to zero if the dimension exceeds the limit dimension, which leads to scrap of the product, as shown in FIG. 2.

Even though the STI technique is becoming more mature, there still exists several problems in the control of the STI CDs:

① Generally, the CD of the top of the STI is determined by the linewidth of an active area between two adjacent STI trenches, while the linewidth of the active area is related to the thickness of a bottom anti-reflective coating (BARC) layer formed thereon and the linewidth of a photoresist pattern on the BARC layer. However, under different spin coating speeds, conventional measurement methods can only measure linewidth of the photoresist, which cannot measure thickness of the BARC layer, thus the CD of the shallow trench cannot meet the expected results.

② During the exposure process, due to the offset of the exposure apparatus itself and other reasons, the linewidth of the photoresist and the coating thickness of the BARC layer may be shifted.

③ During the etching process for forming the STI trench, due to uncertain factors such as variations of atmosphere in the etch chamber or changes in process parameters, the CD of the top of the trenches may deviate from the set value;

④ Especially, when the above mentioned cases both occurred during the lithography and etching process, the root cause of the dimension shifts of the shallow trenches cannot be determined, thus the in-line monitoring and dispatching for the products cannot be achieved, which undoubtedly will produce a huge loss.

In order to solve the above mentioned problems, the industry commonly uses a CD scanning electron microscope (CDSEM) to measure the linewidth of the photoresist pattern. The CDSEM is an electron microscope for forming a scanned image of a sample by scanning an electron beam over the sample surface, detecting secondary electrons generated from the sample, and processing a signal resulting from the detection in synchronism with the scanning of the electron beam.

However, during the practical application, the above monitoring and measuring technique has the following drawbacks:

① Only one linewidth is measured at a time, which is low efficiency;

② Since the BARC thickness is not measured, accurate feedback of the actual BARC layer profile cannot be obtained, accordingly, it is incapable to adjust the process conditions based on the feedback information to precisely control the linewidth dimensions of the STI.

BRIEF SUMMARY OF THE DISCLOSURE

In order to overcome the above problems, the present invention provides a method for controlling the critical dimension of the shallow trench isolation (STI), which utilizes optical critical dimension (OCD) measurement equipment to measure the BARC layer thickness and obtains the critical dimension variation between the top and bottom of the BARC layer corresponding to the measured thicknesses, and adjusting the trimming time (lateral etching time) for the hard mask layer which is formed between the BARC layer and the substrate, so as to precisely control the critical dimension of the active areas in the substrate as well as the critical dimension of the STI.

To achieve the above object, the present invention provides a method for controlling a critical dimension of shallow trench isolations in a STI etch process, wherein the STI etch process comprises the steps of: forming a hard mask layer on a substrate in which active areas are formed, forming a bottom anti-reflective coating layer on the hard mask layer by spin coating, coating a photoresist on the bottom anti-reflective coating layer and patterning to form a photoresist pattern covering the active areas with a target critical dimension, etching the bottom anti-reflective coating layer and the hard mask layer by using the photoresist pattern as a mask according to an etch process recipe and then removing the photoresist pattern and the bottom anti-reflective coating layer, performing a trimming process to the hard mask layer to form a hard mask pattern having a required post-etch critical dimension which is equal to a critical dimension of the active areas, and etching the substrate by using the hard mask pattern as a mask to form the shallow trenches; the method comprises the following two steps:

Step S1: before the STI etch process is performed, pre-establishing a mapping relation between a difference of post-etch and pre-etch critical dimensions of the bottom anti-reflective coating layer and a thickness of the bottom anti-reflective coating layer; wherein Step S1 further comprises:

Step S11: providing different wafers each having the same substrate and hard mask layer as that used in the STI etch process, and performing spin coating to the wafers with different speeds to form bottom anti-reflective coating layers of different thicknesses respectively; forming a photoresist pattern with the target critical dimension on each of the bottom anti-reflective coating layer;

Step S12: measuring the thicknesses of the bottom anti-reflective coating layers and the critical dimension of the photoresist pattern;

Step S13: etching the bottom anti-reflective coating layers of different thicknesses by using the photoresist pattern as a mask according to the etch process recipe that used in the STI etch process, and obtaining the bottom and top critical dimensions of the bottom anti-reflective coating layers;

Step S14: establishing the mapping relation between the critical dimension difference between the bottom and top of the bottom anti-reflective coating layer and the thickness of the bottom anti-reflective coating layer;

Step S2: performing the STI etch process; wherein after coating the bottom anti-reflective coating layer, measuring the thickness of the bottom anti-reflective coating layer and determining a trimming time for the hard mask layer according to a critical dimension difference corresponding to the measured thickness in the mapping relation and the critical dimension of the photoresist pattern, performing the trimming process lasting the trimming time to make the critical dimension of the hard mask pattern equal to the critical dimension of the active areas, etching the substrate by using the hard mask pattern as a mask to form shallow trenches with a predetermined critical dimension.

Preferably, in the Step S12, the thickness of the bottom anti-reflective coating layer and the critical dimension of the photoresist pattern are measured by an optical critical dimension measurement equipment.

Preferably, in the Step S13, the bottom critical dimensions of the bottom anti-reflective coating layers are measured by an optical critical dimension measurement equipment, the top critical dimensions of the bottom anti-reflective coating layers are measured by the optical critical dimension measurement equipment or are equal to the critical dimension of the photoresist pattern.

Preferably, the mapping relation meets the following formula:

$$CD_{bias}=CD_{AEI}-CD_{ADI}=2*THK/Ctg\alpha$$

Wherein $CD_{AEI}$ is a bottom critical dimension of a bottom anti-reflective coating layer with a thickness THK after being etched, $CD_{ADI}$ is a top critical dimension of the bottom anti-reflective coating layer with the thickness THK before being etched, $CD_{bias}$ is a difference in critical dimension of the bottom and top of the bottom anti-reflective coating layer with the thickness THK; α is a sidewall angle of the bottom anti-reflective coating layer.

Preferably, the trimming time t meets the following formula:

$$CD_{AEI}=CD_{ADI}+CD_{bias}+2d*t$$

Wherein $CD_{AEI}$ is the bottom critical dimension of a bottom anti-reflective coating layer, $CD_{ADI}$ is the top critical dimension of the bottom anti-reflective coating layer, which is equal to the critical dimension of the photoresist pattern, $CD_{bias}$ is the difference in critical dimension of bottom and top of the bottom anti-reflective coating layer, d is a lateral etching rate of the trimming process.

The present invention also provides a method for establishing a mapping relation between a difference of post-etch and pre-etch critical dimensions of a bottom anti-reflective coating layer and a thickness of the bottom anti-reflective coating layer, comprising the following steps:

Step S11: providing different wafers having a same substrate and hard mask layer, and performing spin coating to the wafers with different speeds to form bottom anti-reflective coating layers of different thicknesses respectively; forming a same photoresist pattern with a target critical dimension on the bottom anti-reflective coating layers;

Step S12: measuring the thicknesses of the BARC layers and the critical dimension of the photoresist pattern;

Step S13: etching the bottom anti-reflective coating layers of different thicknesses by using the photoresist pattern as a mask according to a same etch process recipe and obtaining the top and bottom critical dimensions of each bottom anti-reflective coating layer;

Step S14: establishing the mapping relation between the critical dimension difference between the bottom and top of the bottom anti-reflective coating layer and the thickness of the bottom anti-reflective coating layer in the case where using the photoresist pattern as a mask for etching the bottom anti-reflective coating layer according to the etch process recipe.

Preferably, in the Step S12, the thickness of the bottom anti-reflective coating layer and the critical dimension of the photoresist pattern are measured by an optical critical dimension measurement equipment.

Preferably, in the Step S13, the bottom critical dimensions of the bottom anti-reflective coating layers are measured by an optical critical dimension measurement equipment, the top critical dimensions of the bottom anti-reflective coating layers are measured by the optical critical dimension measurement equipment or are equal to the critical dimension of the photoresist pattern.

Preferably, the mapping relation meets the following formula:

$$CD_{bias}=CD_{AEI}-CD_{ADI}=2*THK/Ctg\alpha$$

Wherein $CD_{AEI}$ is a bottom critical dimension of a bottom anti-reflective coating layer with a thickness TK after being etched, $CD_{ADI}$ is a top critical dimension of the bottom anti-reflective coating layer with the thickness THK before being etched, $CD_{bias}$ is a difference in critical dimension of the bottom and top of the bottom anti-reflective coating layer with the thickness THK; α is a sidewall angle of the bottom anti-reflective coating layer.

From above, it is known that according to the present invention, the mapping relation between the post-etch and pre-etch critical dimension difference of the BARC layer and the thickness of the BARC layer is pre-established, such that during the actual STI etch process the effect of the BARC layer thickness on the STI critical dimension is considered and the lateral etching time of the hard mask layer which covers the active area between the STIs is correspondingly adjusted, such that can accurately control the critical dimension of the top of the shallow trenches. Compared with the conventional STI etch process which controls the critical dimension merely based on the critical dimension of the photoresist pattern, the present invention improves the process efficiency and the product yield greatly.

DETAILED DESCRIPTION OF THE EMBODIMENTS

Reference will now be made in detail to the present preferred embodiments to provide a further understanding of the invention. The specific embodiments and the accompanying drawings discussed are merely illustrative of specific ways to make and use the invention, and do not limit the scope of the invention or the appended claims.

Hereinafter, a method for improving the critical dimension control for shallow trench isolations (STIs) will be described in detailed by specific embodiments with reference to FIGS. 3-6. It should be noted that the drawings all adopt a much simplified form, use a proportion not precise, and are only used for the purpose of assisting in describing the embodiments of the present invention conveniently and clearly.

Figure 1:
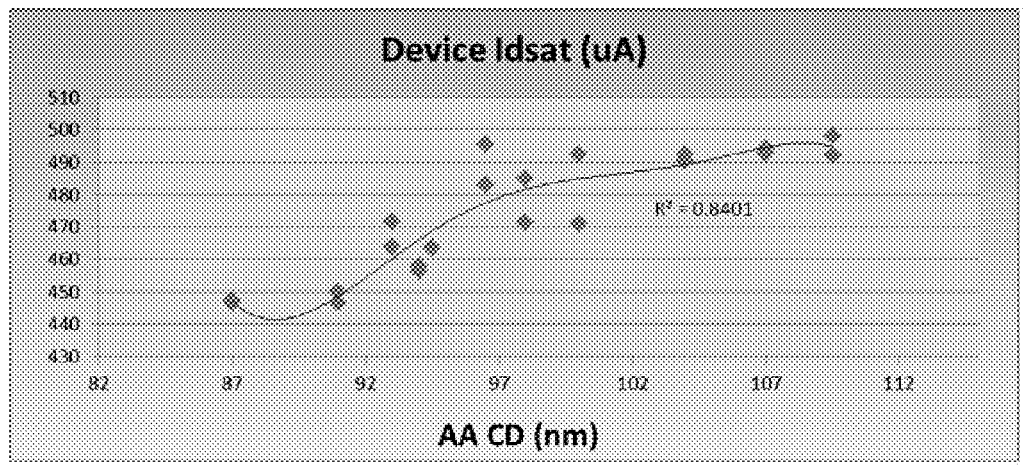
FIG. 1 is a schematic diagram illustrating the impact of the active area critical dimension to the device saturation current (Idsat)
Figure 2:
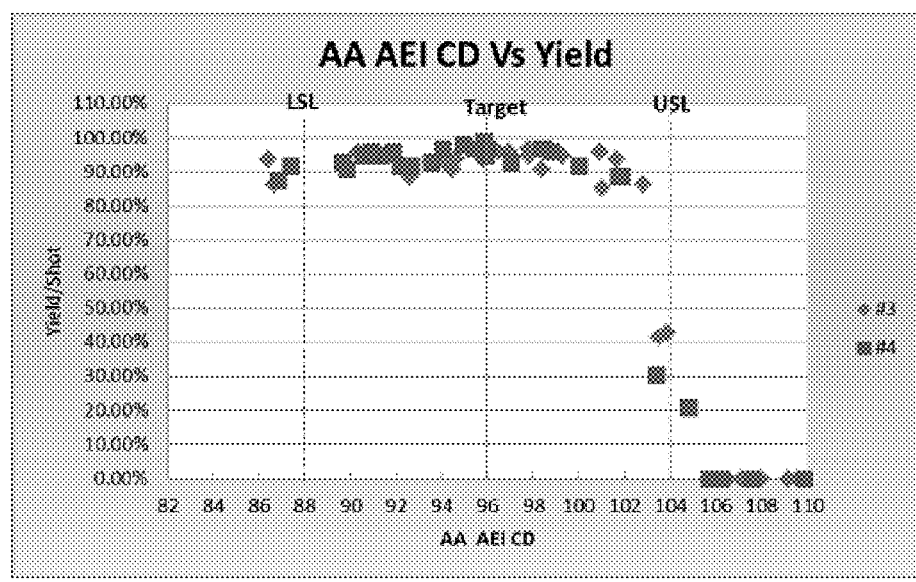
FIG. 2 is a schematic diagram illustrating the impact of the active area critical dimension to the device yield rate.
Figure 3:
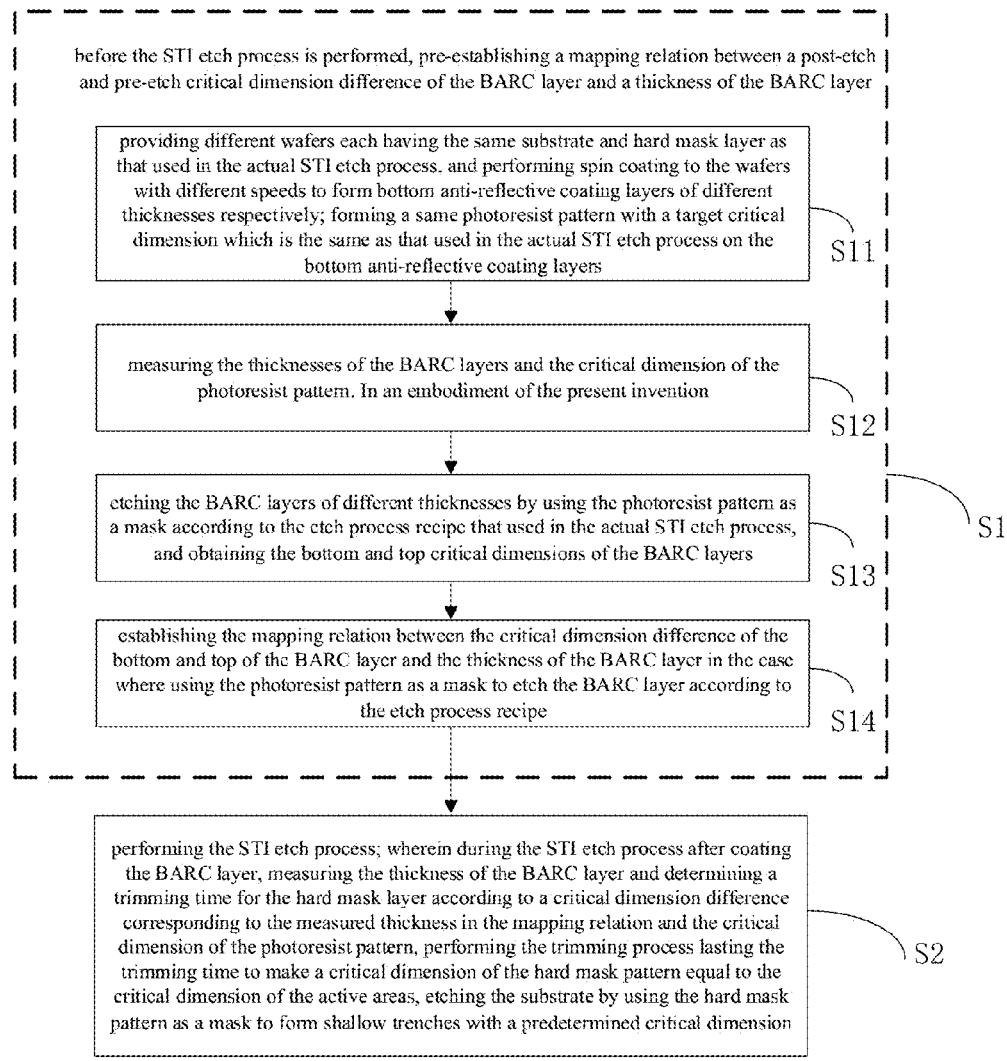
FIG. 3 is a schematic flow chart of a method for improving the STI critical dimension control in accordance with an embodiment of the present invention.

FIG. 3 is a schematic flow chart of a method for controlling the critical dimension of shallow trenches in a STI etch process. The STI etch process comprises the steps of: forming a hard mask layer (such as a silicon nitride layer) on a substrate in which active areas are formed, forming a bottom anti-reflective coating (BARC) layer on the hard mask layer by spin coating, coating a photoresist on the BARC layer and patterning to form a photoresist pattern covering the active area with a target critical dimension, etching the BARC layer and the hard mask layer by using the photoresist pattern as a mask according to an etch process recipe and then removing the photoresist pattern and the BARC layer, performing a trimming process to the hard mask layer to form a hard mask pattern having a required post-etch critical dimension which is equal to a critical dimension of the active areas, and etching the substrate by using the hard mask pattern as a mask to form the shallow trenches. The method comprises the following two steps (step S1 and step S2):

Step S1: before the STI etch process is performed, pre-establishing a mapping relation between a post-etch and pre-etch critical dimension difference of the BARC layer and a thickness of the BARC layer;

Step S2: performing the STI etch process; wherein during the STI etch process after coating the BARC layer, measuring the thickness of the BARC layer and determining a trimming time for the hard mask layer according to a critical dimension difference corresponding to the measured thickness in the mapping relation and the critical dimension of the photoresist pattern, performing the trimming process lasting the trimming time to make a critical dimension of the hard mask pattern equal to the required post-etch critical dimension (the critical dimension of the active areas), etching the substrate by using the hard mask pattern as a mask to form shallow trenches with a predetermined critical dimension.

That is, a mapping relation between a post-etch and pre-etch critical dimension difference of the BARC layer and a thickness of the BARC layer is pre-established before the STI etch process; while during the actual STI etch process, an optical critical dimension measurement equipment is utilized to measure the thickness of the BARC layer such that the corresponding critical dimension difference of the BARC layer can be obtained according to the pre-established mapping relation, and the trimming time for the hard mask layer can be correspondingly regulated, so as to precisely control the critical dimension of the STI. The present invention overcomes the drawback of the prior art, which merely adjusts the critical dimension of the STI based on the critical dimension of the photoresist pattern. Instead, the present invention can precisely control the critical dimension of the STI even the thickness and critical dimension of the BARC layer both vary at the same time, thereby improving the STI process efficiency and the product yield greatly.

In particular, pre-establishing a mapping relation between a post-etch and pre-etch critical dimension difference of the BARC layer and a thickness of the BARC layer specifically includes the following steps:

Step S11: providing different wafers each having the same substrate and hard mask layer as that used in the actual STI etch process, and performing spin coating to the wafers with different speeds to form bottom anti-reflective coating layers of different thicknesses respectively; forming a same photoresist pattern with a target critical dimension which is the same as that used in the actual STI etch process on the bottom anti-reflective coating layers;

Step S12: measuring the thicknesses of the BARC layers and the critical dimension of the photoresist pattern. In an embodiment of the present invention, preferably, an optical critical dimension (OCD) measurement equipment is used to implement the measurement.

Figure 4:
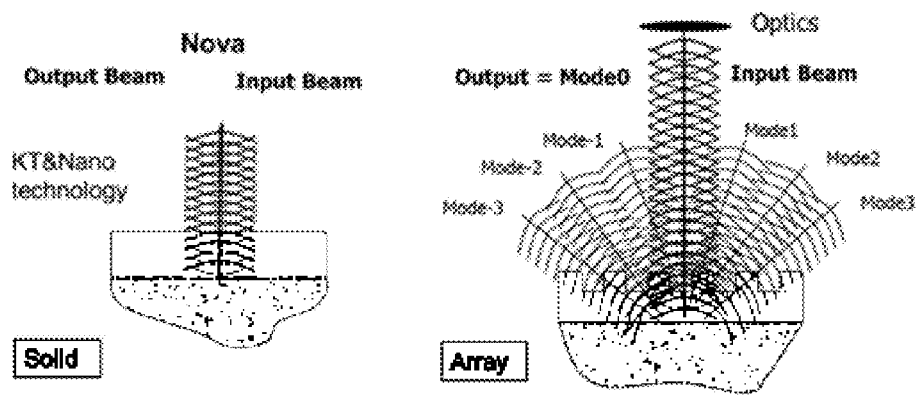
FIG. 4 is a working principle schematic diagram of the optical critical dimension measurement equipment used in the present invention.

Please refer to FIG. 4, which is a working principle schematic diagram of the OCD measurement equipment used in the present invention. As shown, the OCD measurement equipment analyzes the spectral information reflected from a sample. By utilizing the optical property, OCD can detect not only the critical dimension but also the thickness as well as the profile of the BARC layer.

Figure 5:
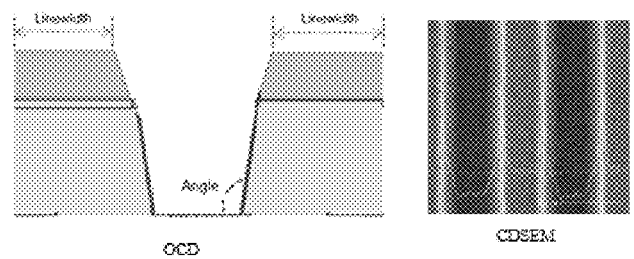
FIG. 5 shows comparison between the critical dimension measurement results using an optical critical dimension measurement equipment (OCD) and an CD scanning electron microscope (CDSEM)

Please refer to FIG. 5, FIG. 5 shows comparison between the critical dimension measurement results using OCD measurement equipment and CD scanning electron microscope (CDSEM). As shown in the figure, the CDSEM is an electron microscope for forming a scanned image of a sample by scanning an electron beam over the sample surface, detecting secondary electrons generated from the sample, and processing a signal resulting from the detection in synchronism with the scanning of the electron beam, which could only measure the critical dimension, but cannot measure the thickness of the BARC layer, and therefore the actual profile information of the BARC layer cannot be accurately obtained.

By contrast, the OCD measurement equipment can be used to measure the critical dimension, the thickness and the profile of the BARC layer (e.g. slope or side wall angle, etc.).

Step S13: etching the BARC layers of different thicknesses by using the photoresist pattern as a mask according to the etch process recipe that used in the actual STI etch process, and obtaining the bottom and top critical dimensions of the BARC layers;

Step S14: establishing the mapping relation between the critical dimension difference of the bottom and top of the BARC layer and the thickness of the BARC layer in the case where using the photoresist pattern as a mask to etch the BARC layer according to the etch process recipe. In an embodiment of the present invention, the mapping relation meets the following formula:

$$CD_{1bias} = CD_{1AEI} - CD_{ADI} = 2*THK1/Ctg\alpha$$

Wherein $CD_{1AEI}$ is a bottom critical dimension of a BARC layer with a thickness THK1 after being etched, $CD_{ADI}$ is a top critical dimension of the BARC layer with the thickness THK1 before being etched, which is ideally equal to the critical dimension of the photoresist pattern, $CD_{1bias}$ is the difference in critical dimension of the bottom and top of the BARC layer with the thickness THK1; $\alpha$ is a sidewall angle of the BARC layer;

$$CD_{2bias} = CD_{2AEI} - CD_{ADI} = 2*THK2/Ctg\alpha$$

Where $CD_{2AEI}$ is a bottom critical dimension of a BARC layer with a thickness THK2 after being etched, $CD_{ADI}$ is a top critical dimension of the BARC layer with the thickness THK2 before being etched, which is ideally equal to the critical dimension of the photoresist pattern, $CD_{2bias}$ is the difference in critical dimension of the bottom and top of the BARC layer with the thickness THK2; $\alpha$ is a sidewall angle of the BARC layer.

In the embodiment of the present invention, the parameters in the above mentioned mapping relation, such as the top and bottom critical dimensions, the thickness and the sidewall angle can all be measured using an OCD measurement equipment, while the top critical dimension of the BARC layer can also use the critical dimension of the photoresist pattern directly. With the above mentioned mapping relation obtained, step S2 could be performed. That is, during performing the STI etch process, measuring the thickness of the BARC layer, and regulating a trimming time for the hard mask layer according to the critical dimension difference of the bottom and top of the BARC layer corresponding to the measured thickness in the mapping relation, so as to form shallow trenches with required critical dimension even the thickness of the BARC layer varies.

Specifically, the trimming time for the hard mask layer meets the following formula:

$$CD_{AEI} = CD_{ADI} + CD_{1bias} + 2d*t_1$$
$$= CD_{ADI} + CD_{2bias} + 2d*t_2$$

Wherein, $CD_{AEI}$ is a pre-set critical dimension of the active area, $CD_{ADI}$ is a top critical dimension of the BARC layer before being etched, which is ideally equal to the critical dimension of the photoresist pattern, $CD_{1bias}$ is the difference in critical dimension of the bottom and top of the BARC layer with the thickness THK1, $CD_{2bias}$ is the difference in critical dimension of the bottom and top of the BARC layer with the thickness THK2, $t_1$ and $t_2$ are corresponding trimming times of the hard mask layer, d is the lateral etching rate of the trimming process.

Figure 6:
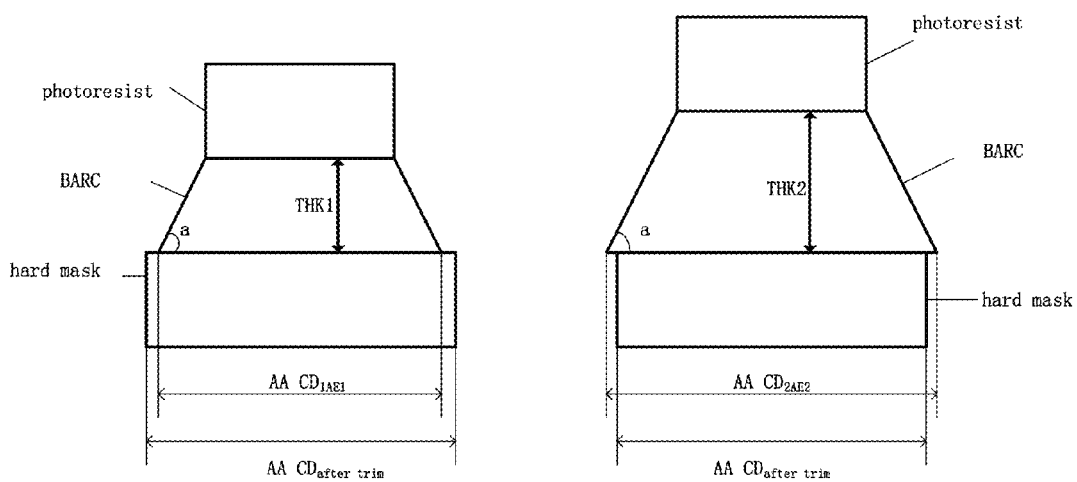
FIG. 6 is a schematic diagram showing shallow trenches with the same critical dimension while the bottom anti-reflective coating (BARC) layers covering the active area have different thicknesses.

Please see FIG. 6, which is a schematic diagram showing two shallow trenches formed with the same critical dimension after the STI etch process during which the BARC layers are formed respectively with different thicknesses. In the embodiment of the present invention, an OCD measurement equipment is utilized to measure the thickness of the BARC layer (shown as TK1 and TK2 in FIG. 6), and the impact of the BARC layer thickness on the critical dimension of the active areas is obtained based on the pre-established mapping relation between the critical dimension difference of the bottom and top of the BARC layer and the thickness of the BARC layer, such that the lateral etching time of the hard mask layer which covers the active area between the STIs can be correspondingly adjusted, thereby accurately controlling the critical dimension of the active area as well as the critical dimension of the top of the shallow trenches. Compared with the conventional STI etch process which controls the critical dimension merely based on the critical dimension of the photoresist pattern, the present invention improves the process efficiency and the product yield greatly While the invention has been described in connection with preferred embodiments, it will be understood that modifications thereof within the principles outlined above will be evident to those skilled in the art, and thus the invention is not limited to the preferred embodiments but is intended to encompass such modifications. The invention resides in each and every novel characteristic feature and each and every combination of characteristic features. Reference numerals in the claims do not limit their protective scope.

The invention claimed is:

1. A method for controlling a critical dimension of shallow trench isolations in a STI etch process, wherein the STI etch process comprises the steps of: forming a hard mask layer on a substrate in which active areas are formed, forming a bottom anti-reflective coating layer on the hard mask layer by spin coating, coating a photoresist on the bottom anti-reflective coating layer and patterning to form a photoresist pattern covering the active areas with a target critical dimension, etching the bottom anti-reflective coating layer and the hard mask layer by using the photoresist pattern as a mask according to an etch process recipe and then removing the photoresist pattern and the bottom anti-reflective coating layer, performing a trimming process to the hard mask layer to form a hard mask pattern having a required post-etch critical dimension which is equal to a critical dimension of the active areas, and etching the substrate by using the hard mask pattern as a mask to form the shallow trenches; the method comprises following two steps:

Step S1: before the STI etch process is performed, pre-establishing a mapping relation between a difference of post-etch and pre-etch critical dimensions of the bottom anti-reflective coating layer and a thickness of the bottom anti-reflective coating layer; wherein Step S1 further comprises:

Step S11: providing different wafers each having the same substrate and hard mask layer as that used in the STI etch process, and performing spin coating to the wafers with different speeds to form bottom anti-reflective coating layers of different thicknesses respectively; forming a photoresist pattern with the target critical dimension on each of the bottom anti-reflective coating layer;

Step S12: measuring the thicknesses of the bottom anti-reflective coating layers and the critical dimension of the photoresist pattern;

Step S13: etching the bottom anti-reflective coating layers of different thicknesses by using the photoresist pattern as a mask according to the etch process recipe that used in the STI etch process, and obtaining the bottom and top critical dimensions of the bottom anti-reflective coating layers;

Step S14: establishing the mapping relation between the critical dimension difference between the bottom and top of the bottom anti-reflective coating layer and the thickness of the bottom anti-reflective coating layer;

Step S2: performing the STI etch process; wherein after coating the bottom anti-reflective coating layer, measuring the thickness of the bottom anti-reflective coating layer and determining a trimming time for the hard mask layer according to a critical dimension difference corresponding to the measured thickness in the mapping relation and the critical dimension of the photoresist pattern, performing the trimming process lasting the trimming time to make the critical dimension of the hard mask pattern equal to the critical dimension of the active areas, etching the substrate by using the hard mask pattern as a mask to form shallow trenches with a predetermined critical dimension.

2. The method according to claim 1, wherein in the Step S12, the thickness of the bottom anti-reflective coating layer and the critical dimension of the photoresist pattern are measured by an optical critical dimension measurement equipment.

3. The method according to claim 2, wherein in the Step S13, the bottom critical dimensions of the bottom anti-reflective coating layers are measured by the optical critical dimension measurement equipment, the top critical dimensions of the bottom anti-reflective coating layers are measured by the optical critical dimension measurement equipment or are equal to the critical dimension of the photoresist pattern.

4. The method according to claim 1, wherein the mapping relation meets the following formula:

$$CD_{bias} = CD_{AEI} - CD_{ADI} = 2*THK/Ctg\alpha$$

Where $CD_{AEI}$ is a bottom critical dimension of a bottom anti-reflective coating layer with a thickness THK after etching the bottom anti-reflective coating layer, $CD_{ADI}$ is a top critical dimension of the bottom anti-reflective coating layer with the thickness THK before etching the bottom anti-reflective coating layer, $CD_{bias}$ is the difference in critical dimension of the bottom and top of the bottom anti-reflective coating layer with the thickness THK; $\alpha$ is a sidewall angle of the bottom anti-reflective coating layer.

5. The method according to claim 1, wherein the trimming time t meets the following formula:

$$CD_{AEI} = CD_{ADI} + CD_{1bias} + 2d*t$$

Where $CD_{AEI}$ is the bottom critical dimension of a bottom anti-reflective coating layer, $CD_{ADI}$ is the top critical dimension of the bottom anti-reflective coating layer, which is equal to the critical dimension of the photoresist pattern, $CD_{1bias}$ is the difference in critical dimension of bottom and top of the bottom anti-reflective coating layer, d is a lateral etching rate of the trimming process.

6. A method for establishing a mapping relation between a difference of post-etch and pre-etch critical dimensions of a bottom anti-reflective coating layer and a thickness of the bottom anti-reflective coating layer, comprising the following steps:

Step S11: providing different wafers having a same substrate and hard mask layer, and performing spin coating to the wafers with different speeds to form bottom anti-reflective coating layers of different thicknesses respectively; forming a same photoresist pattern with a target critical dimension on the bottom anti-reflective coating layers;

Step S12: measuring the thicknesses of the BARC layers and the critical dimension of the photoresist pattern;

Step S13: etching the bottom anti-reflective coating layers of different thicknesses by using the photoresist pattern as a mask according to a same etch process recipe and obtaining the top and bottom critical dimensions of each bottom anti-reflective coating layer;

Step S14: establishing the mapping relation between the critical dimension difference between the bottom and top of the bottom anti-reflective coating layer and the thickness of the bottom anti-reflective coating layer in the case where using the photoresist pattern as a mask for etching the bottom anti-reflective coating layer according to the etch process recipe.

7. The method according to claim 6, wherein in the Step S12, the thickness of the bottom anti-reflective coating layer and the critical dimension of the photoresist pattern are measured by an optical critical dimension measurement equipment.

8. The method according to claim 7, wherein in the Step S13, the bottom critical dimensions of the bottom anti-reflective coating layers are measured by the optical critical dimension measurement equipment, the top critical dimensions of the bottom anti-reflective coating layers are measured by the optical critical dimension measurement equipment or are equal to the critical dimension of the photoresist pattern.

9. The method according to claim 7, wherein the mapping relation meets the following formula:

$$CD_{bias} = CD_{AEI} - CD_{ADI} = 2*THK/Ctg\alpha$$

Where $CD_{AEI}$ is a bottom critical dimension of a bottom anti-reflective coating layer with a thickness TK after being etched, $CD_{ADI}$ is a top critical dimension of the bottom anti-reflective coating layer with the thickness THK before being etched, $CD_{bias}$ is the difference in critical dimension of the bottom and top of the bottom anti-reflective coating layer with the thickness THK; a is a sidewall angle of the bottom anti-reflective coating layer.

10. The method according to claim 2, wherein the mapping relation meets the following formula:

$$CD_{bias} = CD_{AEI} - CD_{ADI} = 2*THK/Ctg\alpha$$

Where $CD_{AEI}$ is a bottom critical dimension of a bottom anti-reflective coating layer with a thickness THK after etching the bottom anti-reflective coating layer, $CD_{ADI}$ is a top critical dimension of the bottom anti-reflective coating layer with the thickness THK before etching the bottom anti-reflective coating layer, $CD_{bias}$ is the difference in critical dimension of the bottom and top of the bottom anti-reflective coating layer with the thickness THK; a is a sidewall angle of the bottom anti-reflective coating layer.

11. The method according to claim 3, wherein
the mapping relation meets the following formula:

$$CD_{bias}=CD_{AEI}-CD_{ADI}=2*THK/Ctg\alpha$$

Where $CD_{AEI}$ is a bottom critical dimension of a bottom anti-reflective coating layer with a thickness THK after etching the bottom anti-reflective coating layer, $CD_{ADI}$ is a top critical dimension of the bottom anti-reflective coating layer with the thickness THK before etching the bottom anti-reflective coating layer, $CD_{bias}$ is the difference in critical dimension of the bottom and top of the bottom anti-reflective coating layer with the thickness THK; a is a sidewall angle of the bottom anti-reflective coating layer.

12. The method according to claim 2, wherein
the trimming time t meets the following formula:

$$CD_{AEI}=CD_{ADI}+CD_{1bias}+2d*t$$

Where $CD_{AEI}$ is the bottom critical dimension of a bottom anti-reflective coating layer, $CD_{ADI}$ is the top critical dimension of the bottom anti-reflective coating layer, which is equal to the critical dimension of the photoresist pattern, $CD_{1bias}$ is the difference in critical dimension of bottom and top of the bottom anti-reflective coating layer, d is a lateral etching rate of the trimming process.

13. The method according to claim 3, wherein
the trimming time t meets the following formula:

$$CD_{AEI}=CD_{ADI}+CD_{1bias}+2d*t$$

Where $CD_{AEI}$ is the bottom critical dimension of a bottom anti-reflective coating layer, $CD_{ADI}$ is the top critical dimension of the bottom anti-reflective coating layer, which is equal to the critical dimension of the photoresist pattern, $CD_{1bias}$ is the difference in critical dimension of bottom and top of the bottom anti-reflective coating layer, d is a lateral etching rate of the trimming process.

14. The method according to claim 8, wherein the mapping relation meets the following formula:

$$CD_{bias}=CD_{AEI}-CD_{ADI}=2*THK/Ctg\alpha$$

Where $CD_{AEI}$ is a bottom critical dimension of a bottom anti-reflective coating layer with a thickness TK after being etched, $CD_{ADI}$ is a top critical dimension of the bottom anti-reflective coating layer with the thickness THK before being etched, $CD_{bias}$ is the difference in critical dimension of the bottom and top of the bottom anti-reflective coating layer with the thickness THK; a is a sidewall angle of the bottom anti-reflective coating layer.

* * * * *